United States Patent [19]
Kadota et al.

[11] Patent Number: 5,184,042
[45] Date of Patent: Feb. 2, 1993

[54] SURFACE WAVE DEVICE

[75] Inventors: Michio Kadota; Kazuhiko Morozumi, both of Nagaokakyo, Japan

[73] Assignee: Murata Manufacturing Co., Ltd., Japan

[21] Appl. No.: 701,221

[22] Filed: May 16, 1991

[30] Foreign Application Priority Data

May 21, 1990 [JP] Japan .................. 2-131592

[51] Int. Cl.$^5$ .......................... H01L 41/03
[52] U.S. Cl. .................. 310/313 A; 310/313 B; 333/193
[58] Field of Search .............. 310/313 A, 313 B; 333/193

[56] References Cited

U.S. PATENT DOCUMENTS

| | | | |
|---|---|---|---|
| 4,243,960 | 1/1981 | White et al. | 310/313 R |
| 4,295,108 | 10/1981 | Ieki | 333/193 |
| 4,401,956 | 8/1983 | Joshi | 310/313 D |
| 4,435,441 | 3/1984 | Mariani et al. | 427/10 |
| 4,523,119 | 6/1985 | Whatmore et al. | 310/313 A |
| 4,602,182 | 7/1986 | Webster | 310/313 A |

FOREIGN PATENT DOCUMENTS 2016849 9/1979 United Kingdom .

Primary Examiner—Mark O. Budd
Assistant Examiner—Thomas M. Dougherty
Attorney, Agent, or Firm—Ostrolenk, Faber, Gerb & Soffen

[57] ABSTRACT

A surface wave device utilizing a surface wave of an SH type whose displacement is mainly displacement in the direction perpendicular to the direction of the surface wave propagation, the above piezoelectric substrate being made of a piezoelectric material whose ratio of the elastic stiffness constant $C_{33}{}^D$ to the elastic stiffness constant $C_{44}{}^E$ is more than 4.

8 Claims, 5 Drawing Sheets

SURFACE WAVE DEVICE

BACKGROUND OF THE INVENTION

1. Field of the Invention

The present invention relates to a surface wave device utilizing a surface wave of an SH type, whose displacement is mainly displacement in the direction perpendicular to the direction of the surface wave propagation, such as a BGS wave (Bleustein-Gulyaev-Shimizu Wave).

2. Description of the Prior Art

Examples of a surface wave of an SH type whose displacement is mainly displacement in the direction perpendicular to the direction of the surface wave propagation include a BGS wave (also referred to as a piezoelectric shear wave) and a Love wave.

The BGS wave is excited when a material such as piezoelectric ceramics is used to construct, for example, a resonator shown in FIG. 2. In FIG. 2, reference numeral 1 denotes a piezoelectric substrate, which is made of the above described piezoelectric material. Reference numerals 2 and 3 respectively denote comb electrodes. The comb electrodes 2 and 3 respectively have a plurality of electrode fingers 2a and 3a which are inserted into each other. An arrow P indicates an axis of polarization.

In a piezoelectric resonator 4 shown in FIG. 2, if an AC electric field is applied from the comb electrodes 2 and 3, a BGS wave is excited whose displacement is only displacement in the direction perpendicular to the direction A of the surface wave propagation, that is, which has only a shear wave component. The above described piezoelectric resonator using the BGS wave is disclosed in, for example, Proceedings of Conference on the Acoustical Society of Japan, May 1976, pp 351 to 352.

In the surface wave resonator 4 utilizing the BGS wave, the BGS wave is completely reflected from free end surfaces 1a and 1b of the piezoelectric substrate 1. Consequently, reflectors must be formed on regions outside the comb electrodes in a surface wave resonator utilizing a Rayleigh wave, while such reflectors can be omitted in the surface wave resonator 4 utilizing the BGS wave. Accordingly, the surface wave resonator 4 utilizing the BGS wave has the great advantages that its chip size can be significantly decreased to one tenth as compared to the size of the resonator utilizing the Rayleigh wave and it can be applied in the band of high frequencies of 5 MHz to 70 MHz if the precision of the free end surfaces 1a and 1b is increased.

The surface wave resonator 4 utilizing the BGS wave, however, actually has the disadvantage in that ripples and an unnecessary spurious mode occur on impedance-frequency characteristics as shown in FIG. 3 even if the precision of the free end surfaces 1a and 1b is increased. More specifically, as indicated by an arrow B in FIG. 3, ripples and an unnecessary spurious mode occur to a considerable extent in the vicinity of the antiresonance frequency or a lower frequency region. Therefore, a surface wave device utilizing a surface wave of an SH type has not come in practice yet irrespective of the above described great advantages that its chip size can be decreased and it is applicable in a high frequency region.

SUMMARY OF THE INVENTION

Accordingly, an object of the present invention is to provide a surface wave device utilizing a surface wave of an SH type in which occurrence of ripples and an unnecessary spurious mode is reduced.

The present invention is directed to a surface wave device utilizing a surface wave of an SH type whose displacement is mainly displacement in the direction perpendicular to the direction of the surface wave propagation out of surface waves which are propagated on a piezoelectric substrate, a piezoelectric substrate being made of a piezoelectric material whose ratio of the elastic stiffness constant $C_{33}^D$ to the elastic stiffness constant $C_{44}^E$ is more than 4. Piezoelectric ceramics is used as the piezoelectric material, and the axis of polarization of the piezoelectric substrate is perpendicular to the direction of the surface wave propagation and parallel to the surface of the piezoelectric substrate, thereby to excite a BGS wave.

Examples of the surface wave of an SH type according to the present invention include a surface wave, whose displacement is mainly displacement perpendicular to the direction of the propagation, such as a Love wave in addition to the above described BGS wave.

Furthermore, the elastic stiffness constants $C_{33}^D$ and $C_{44}^E$ of the piezoelectric material are respectively defined as follows:

Let T be stress and let S be strain.

$C_{33}^D$: the elastic stiffness constant in a case where electric displacement is constant, which is expressed by $\partial T_3/\partial S_3$.

$C_{44}^E$: the elastic stiffness constant in a case where an electric field is constant, which is expressed by $\partial T_5/\partial S_5$.

The above described elastic stiffness constants $C_{33}^D$ and $C_{44}^E$ are respectively derived from piezoelectric equations.

More specifically, if as shown in FIG. 4A, electrodes 12 and 13 are formed on both major surfaces of a piezoelectric substrate 11 and the area of the electrodes 12 and 13 is larger than the area of a side surface 11a of the piezoelectric substrate 11, there is a relationship $V_l = \sqrt{(C_{33}^D/\rho)}$ between the longitudinal wave velocity $V_l$ and $C_{33}^D$ in applying and electric field between the electrodes 12 and 13, where $\rho$ represents the density and an arrow P in FIG. 4A indicates the direction of polarization.

On the other hand, if as shown in FIG. 4B, electrodes 22 and 23 are formed on side surfaces 21a and 21b, whose area is relatively small, of a piezoelectric substrate 21, there is a relationship $V_S = \sqrt{(C_{44}^E/\rho)}$ between $C_{44}^E$ and the shear wave velocity $V_S$ in applying an electric field between the electrodes 22 and 23.

Meanwhile, the velocity of the BGS wave is expressed by the following equation when a conductor is formed on the surface of the piezoelectric substrate:

$$V_m = \sqrt{\frac{C_{44}^D}{\rho}(1 - K_{15}^4)} = \sqrt{\frac{C_{44}^E}{\rho}(1 + K_{15}^2)}$$

On the other hand, the velocity thereof is expressed by the following equation when no conductor is formed:

$$V_f = \sqrt{\frac{C_{44}^D}{\rho} \left(1 - \frac{K_{15}^4}{(1 + \epsilon_{11}^S/\epsilon_0)^2}\right)}$$

$$= \sqrt{\frac{C_{44}^E}{\rho} \left(\frac{1 - K_{15}^4/(1 + \epsilon_{11}^S/\epsilon_0)^2}{1 - K_{15}^2}\right)}.$$

In the foregoing equations, $K_{15}$ represents an electromechanical coupling factor.

In the present invention, a piezoelectric substrate is made of a piezoelectric material whose ratio of the elastic stiffness constant $C_{33}^D$ to the elastic stiffness constant $C_{44}^E$ is more than 4, thereby to make it possible to effectively restrain occurrence of an unnecessary spurious mode in the surface wave device utilizing a surface wave of an SH type, as obvious from an embodiment as described later.

Consequently, the utilization of a surface wave of an SH type, which is completely reflected from free end surfaces, such as a BGS wave makes it possible to provide a surface wave device much smaller in size than and superior in characteristics to a conventional surface wave device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description is now made of one embodiment of the present invention. The present embodiment is applied to a surface wave resonator utilizing a BGS wave shown in FIG. 2.

Figure 2:
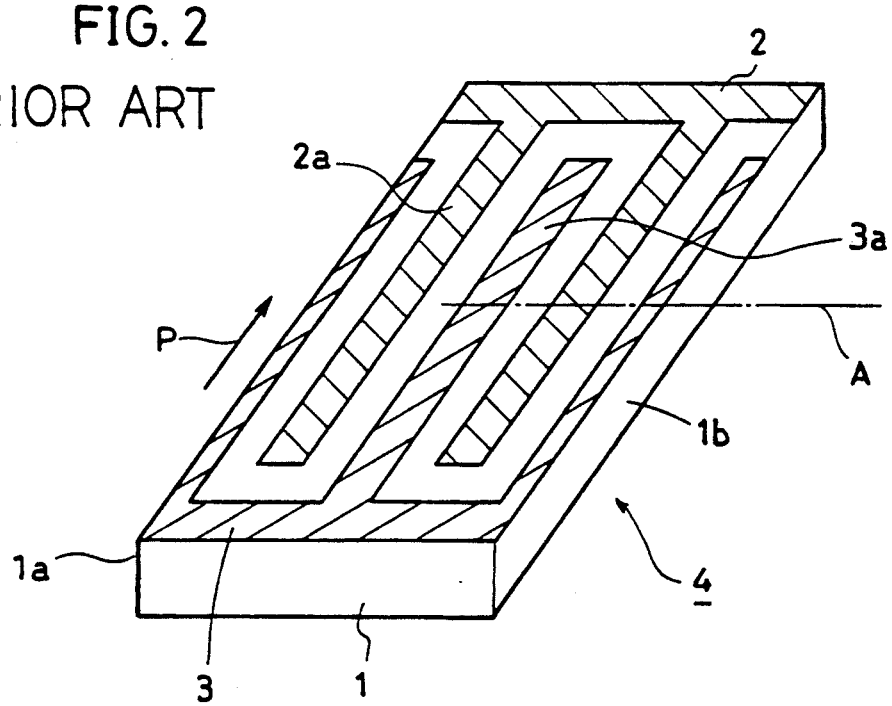
FIG. 2 is a perspective view for explaining the structure of a conventional surface wave resonator utilizing reflection of a BGS wave at an end surface.

In the resonator 4 shown in FIG. 2, the direction of polarization P is extended in the direction parallel to the electrode fingers 2a and 3a of the comb electrodes 2 and 3, as described above. Consequently, if the AC electric field is applied between the comb electrodes 2 and 3, the surface wave having only a shear wave component, that is, the BGS wave is generated.

Figure 1:
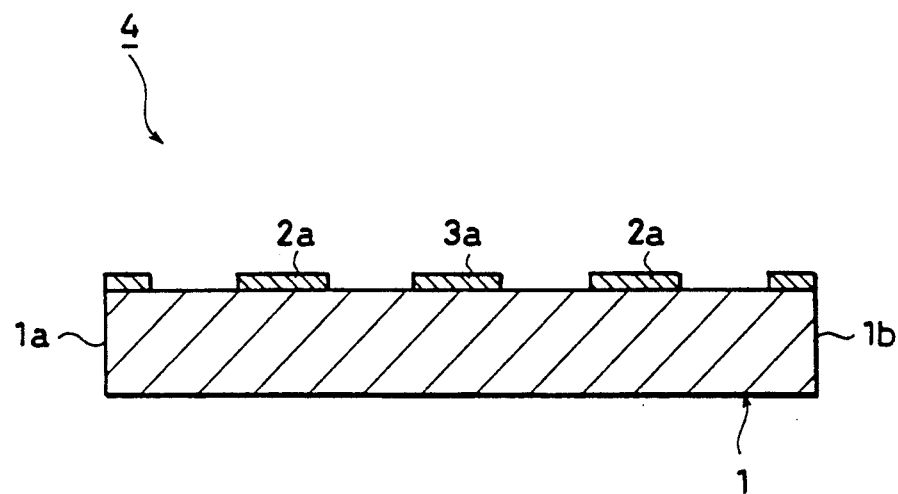
FIG. 1 is a schematic cross sectional view showing a surface wave resonator to which one embodiment of the present invention is applied.

A surface wave resonator 4 to which the present embodiment is applied is structurally the same as that shown in FIG. 2. For description, however, its cross-sectional structure is schematically shown in FIG. 1. Respective electrode fingers 2a and 3a of comb electrodes 2 and 3 are so adapted as to have a width of $\lambda/4$ when $\lambda$ is taken as the wavelength of a surface wave, through they have a width of $\lambda/8$ in the vicinities of free end surfaces 1a and 1b. In addition, the piezoelectric resonator 4 may be so designed that the width (the distance between the end surfaces 1a and 1b) of a piezoelectric substrate 1 is an integral multiple of $\lambda/2$.

When the above described surface wave resonator 4 is designed using a given piezoelectric material, however, ripples and an unnecessary spurious mode appear on impedance-frequency characteristics after completion thereof even if the precision of the free end surfaces 1a and 1b is increased.

The inventors of the present application have paid attention to the above described elastic stiffness constants $C_{33}^D$ and $C_{44}^E$ of the piezoelectric material, to fabricate various surface wave resonators 4 which differ in the ratio $C_{33}^D/C_{44}^E$ and measure their characteristics. The results show clearly that impedance-frequency characteristics on which ripples and an unnecessary spurious mode hardly occur in the vicinity of the antiresonance frequency and between the resonance and antiresonance frequencies are achieved when $C_{33}^D/C_{44}^E$ is 5.9.

Figure 5:
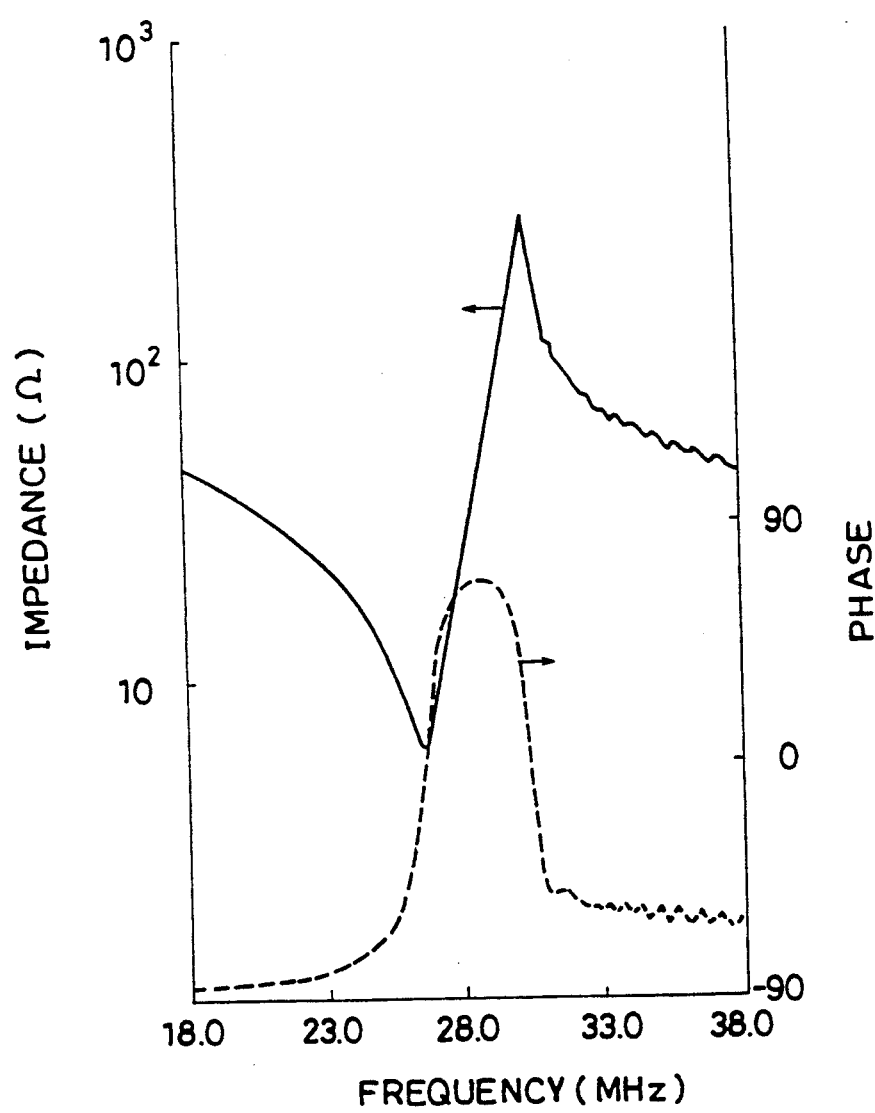
FIG. 5 is a diagram showing impedance-frequency characteristics of a surface wave resonator according to one embodiment of the present invention.

FIG. 5 shows characteristics measured using as the piezoelectric material one having composition of Pb $(Sn_{\frac{1}{2}} Sb_{\frac{1}{2}}) O_3$-$PbTiO_3$-$PbZrO_3$ and containing 46 mol % of Zr and 2.5 mol % of Sn and Sb.

Figure 3:
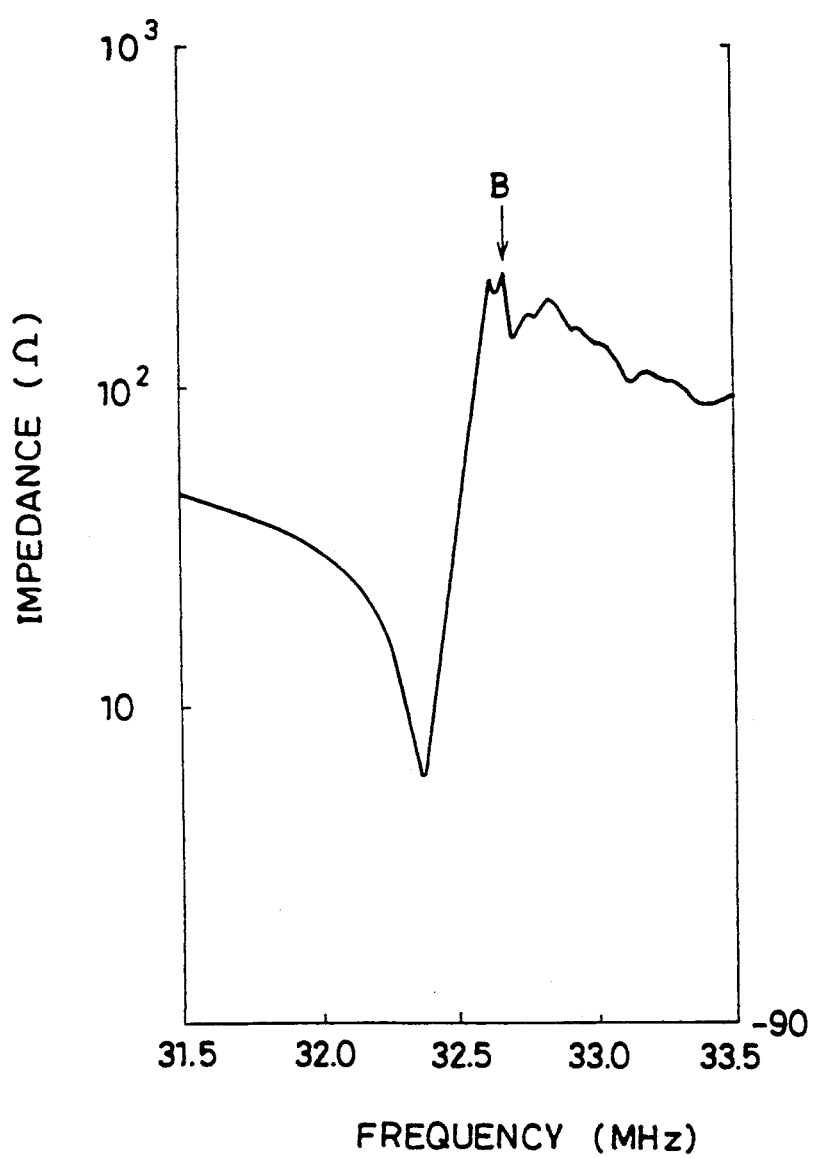
FIG. 3 is a diagram showing impedance-frequency characteristics of the conventional surface wave resonator shown in FIG. 2.
Figure 4A:
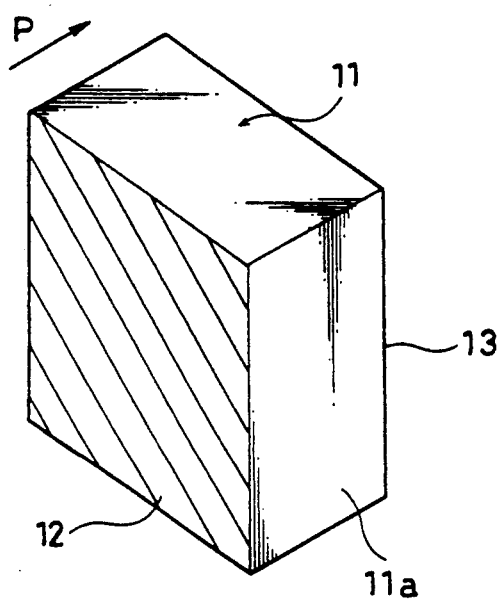
FIGS. 4A and 4B are perspective views for each explaining the relation between the elastic stiffness constant and the velocity.
Figure 4B:
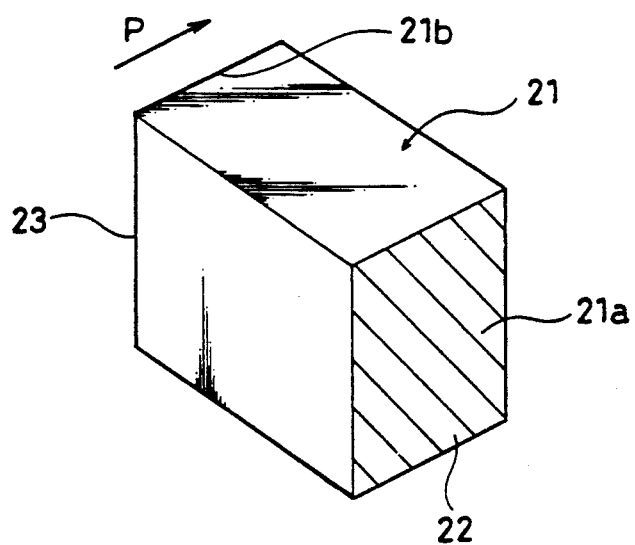

FIG. 3 shows characteristics in the conventional example using as a material whose ratio of $C_{33}^D$ to $C_{44}^E$ is 3.4 one having the same composition as described above and containing 69 mol % of Zr and 2.5 mol % of Sn and Sb.

Furthermore, when frequency characteristics of surface wave resonators which are made different in the ratio $C_{33}^D/C_{44}^E$ are measured, the results shown in the following table 1 are obtained.

TABLE 1

| $C_{33}^D/C_{44}^E$ | frequency characteristics |
| --- | --- |
| 5.9 | ◯ |
| 5.2 | ◯ |
| 4.0 | X |
| 3.1 | X |
| 3.2 | X |
| 3.6 | X |
| 4.2 | ◯ |

In Table 1, a mark of X is put when ripples and an unnecessary spurious mode occur on the frequency characteristics and a mark of ◯ is put when ripples and an unnecessary spurious mode hardly occur on the frequency characteristics, to indicate whether or not the frequency characteristics are good.

As can be seen from the results of the table 1, if a piezoelectric material whose ratio of $C_{33}^D$ to $C_{44}^E$ is more than 4 is used, a BGS wave in which ripples and unnecessary response hardly occur is excited. Consequently, if a surface wave resonator having a structure shown in FIGS. 1 and 2 is constructed using such a piezoelectric material, it is possible to realize a resonator utilizing a BGS wave which is small in size and has good frequency characteristics.

Examples of the piezoelectric material used for constructing the above described surface wave resonator according to the embodiment include piezoelectric ceramics having various compositions.

Figure 6A:
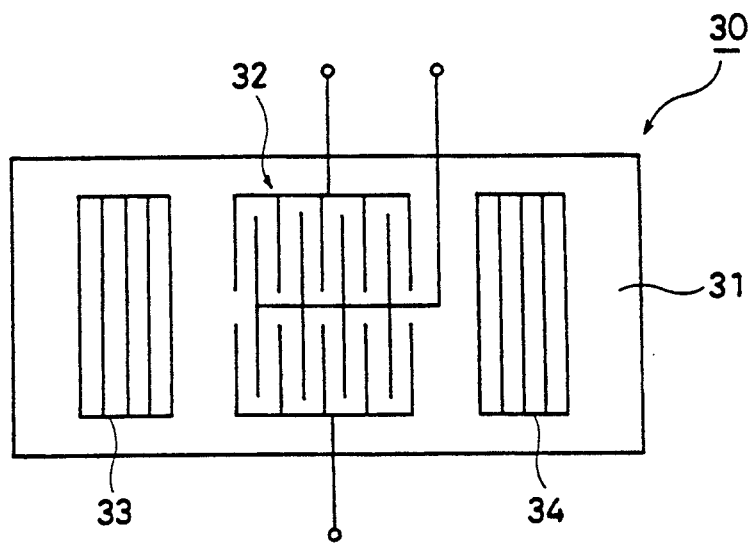
FIGS. 6A and 6B are schematic plan views each showing a double-mode filter to which the present invention is applied.
Figure 6B:
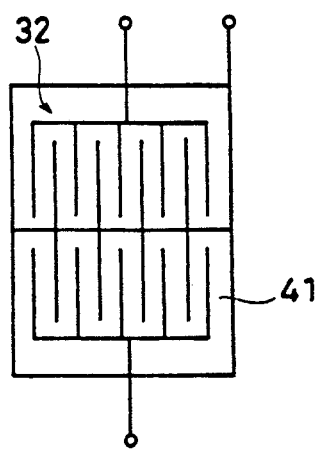

A surface wave device to which the present invention is also applied is not limited to the above described surface wave resonator. That is, the present invention is applicable to filter devices such as a transversal filter and a double-mode filter. For example, as shown in FIG. 6A, a double-mode filter 30 using grating reflectors is so adapted that grating reflectors 33 and 34 are provided in side parts of an interdigital transducer portion 32 for constituting a filter. It is needless to say that the present invention can be also applied to such a filter 30 to remove a spurious mode. Furthermore, as shown in FIG. 6B, if not reflectors but the same end surface reflectors as those shown in FIG. 1 are utilized, it is possible to rapidly decrease the length of a piezoelectric substrate 41 in the direction of the surface wave propagation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface wave device comprising:
   a piezoelectric substrate made of a piezoelectric material; and
   electrodes for exciting in said piezoelectric substrate a surface wave of an SH type whose displacement is mainly displacement in the direction perpendicular to the direction of the surface wave propagation,
   said piezoelectric substrate being made of a piezoelectric material whose ratio of the elastic stiffness constant $C_{33}^D$ to the elastic stiffness constant $C_{44}^E$ is more than 4.

2. The surface wave device according to claim 1, wherein said piezoelectric material is made of piezoelectric ceramics, and the axis of polarization of the piezoelectric substrate is perpendicular to the direction of the surface wave propagation and parallel to the surface of the piezoelectric substrate.

3. The surface wave device according to claim 2, wherein said piezoelectric substrate has a rectangular shape having a pair of free end surfaces opposed to each other, and said electrodes are provided so as to propagate the surface wave of an SH type in the direction connecting said free end surfaces.

4. The surface wave device according to claim 3, wherein said electrodes comprise a pair of comb electrodes each having a plurality of electrode fingers, and the plurality of electrode fingers in each of the comb electrodes are arranged in parallel with said free end surfaces.

5. The surface wave device according to claim 1, wherein said surface wave of an SH type is a BGS wave.

6. The surface wave device according to claim 1, wherein said surface wave of an SH type is a Love wave.

7. The surface wave device according to claim 1, wherein said surface wave device is a surface wave resonator.

8. The surface wave device according to claim 1, wherein said surface wave device is a surface wave filter.

* * * * *